United States Patent [19]

Sakemi et al.

[11] Patent Number: 5,677,012
[45] Date of Patent: Oct. 14, 1997

[54] PLASMA PROCESSING METHOD AND PLASMA PROCESSING APPARATUS

[75] Inventors: Toshiyuki Sakemi; Masaru Tanaka, both of Ehime, Japan

[73] Assignee: Sumitomo Heavy Industries, Ltd., Tokyo, Japan

[21] Appl. No.: 579,158

[22] Filed: Dec. 27, 1995

[30] Foreign Application Priority Data

Dec. 28, 1994 [JP] Japan ................................ 6-328713

[51] Int. Cl.$^6$ ........................................................ B05D 3/06
[52] U.S. Cl. ................ 427/523; 204/298.05; 118/723 R; 118/723 HC
[58] Field of Search ............... 204/298.05; 118/726, 118/723 HC, 723 R, 723 IR; 427/523, 524, 525, 526, 527

[56] References Cited

U.S. PATENT DOCUMENTS

| | | |
|---|---|---|
| 3,956,093 | 5/1976 | McLeod . |
| 4,885,070 | 12/1989 | Campbell et al. ............. 204/298.05 X |
| 5,009,922 | 4/1991 | Harano et al. ................ 204/298.05 X |

FOREIGN PATENT DOCUMENTS

| | | |
|---|---|---|
| 0 284 436 | 9/1988 | European Pat. Off. . |
| 41 14 752 A1 | 4/1992 | Germany . |
| 4-254583 | 9/1992 | Japan ....................... 204/298.05 |
| 7-138743 | 5/1995 | Japan . |

OTHER PUBLICATIONS

Patent Abstract of Japan, vol. 018, No. 351 (C–1220), 4 Jul. 1994 & JP–A–06 088216 (Nippon Sheet Glass Co Ltd), 29 Mar. 1994. (English Abstract).

Patent Abstracts of Japan, vol. 017, No. 236 (C–1057), 13 May 1993 & JP–A–04 365854 (Ulvac Japan Ltd; Others: 01), 17 Dec. 1992. (English Abstract).

Patents Abstract of Japan, vol. 95, No. 005 & JP–A–07 138743 (Sumitomo Heavy Ind Ltd), 30 May 1995. (English Abstract).

*Primary Examiner*—Nam Nguyen
*Attorney, Agent, or Firm*—Burns, Doane, Swecker & Mathis, LLP

[57] ABSTRACT

A plasma processing apparatus comprises a vacuum chamber, a plasma beam generator arranged in the vacuum chamber, and a main hearth located in the vacuum chamber and is for carrying out a step of a plasma beam produced by the plasma beam generator to the main hearth. The plasma processing apparatus further comprises a permanent magnet and a hearth coil arranged in the vicinity of the main hearth to be concentric with a center axis of the main hearth to be concentric with a center axis of the main hearth. The meltability of a material and the flight distribution of the vapor particles derived from a vaporizable material are adjusted by varying an electric current supplied to the hearth coil.

7 Claims, 6 Drawing Sheets

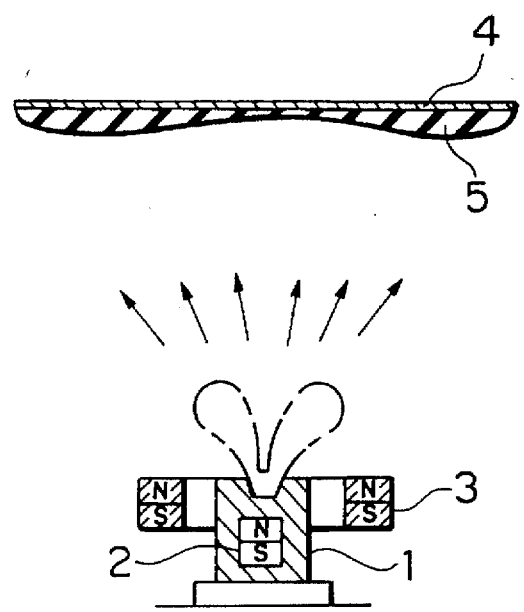
PRIOR ART
FIG. 1
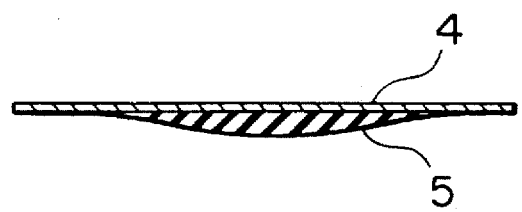
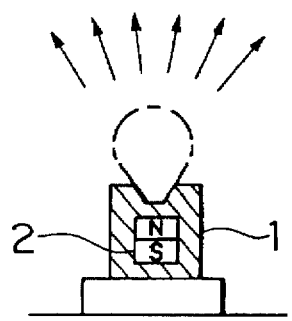
PRIOR ART
FIG. 2

PLASMA PROCESSING METHOD AND PLASMA PROCESSING APPARATUS

BACKGROUND OF THE INVENTION

This invention relates to a plasma processing method and a plasma processing apparatus and, in particular, to a plasma processing method and a plasma processing apparatus adapted to form a metal film or an alloy film on a surface of a substrate and to melt a material put on a hearth.

A plasma processing apparatus of the type comprises a beam source such as a pressure gradient type or a HCD type plasma source for producing a plasma beam, and a hearth located in a vacuum chamber and having an incident surface for the plasma beam. The hearth serves as an anode. The plasma beam produced by the beam source is guided to the incident surface of the hearth.

In order to adhere a vaporizable material onto the surface of a substrate arranged opposite to the hearth by the use of the plasma processing apparatus described above, the vaporizable material is put on the hearth. When exposed to the plasma beam, the vaporizable material is evaporated and ionized to produce vapor particles. The vapor particles fly towards the substrate arranged opposite to the hearth and adhere onto the surface of the substrate. As a result, a coating film made of the vaporizable material is formed on the surface of the substrate.

In the meanwhile, it is desired that the coating film formed on the surface of the substrate has a uniform distribution of a film thickness. As a technique to provide such uniform distribution of the film thickness, several conventional methods are known as will presently be described. In a first method, a sufficiently long distance is kept between the hearth and the substrate. In a second method, the substrate is rotated or moved during deposition of the coating film. In the second method, adjustment is made of the amount of the vaporizable material to be adhered onto the substrate by arranging a film thickness correction plate (a mask plate) between the hearth and the substrate. The film thickness correction plate has an opening portion which is wider in its peripheral region than in its central region just above the hearth. Therefore, a greater amount of the vaporizable material flies towards the peripheral region than to the central region just above the hearth.

The vaporizable material is uniformly deposited on the substrate by a combination of horizontal movement of the substrate and the film thickness correction plate. In either of the first and the second methods, it is possible to achieve the uniform distribution of the film thickness. However, a film deposition rate becomes low and the vaporizable material can not be effectively used. This is because the vaporizable material often flies out of the substrate and may adhere onto the film thickness correction plate. In addition, in the second method, the apparatus is inevitably complicated in structure.

On the other hand, the plasma processing apparatus described above is also used to melt a material such as Ti, SUS 306, and Mo put on the hearth by the use of the plasma beam.

In order to melt such a material which is hard to melt, it is desired that the greater input energy is supplied to the hearth. In order to melt various kinds of materials, it is desired that the level of the input energy can be adjusted over a wide range. The greater input energy is obtained by increasing a hearth voltage and a discharge current. The level of the input energy can be adjusted by controlling a voltage supplied between the plasma source and the hearth.

However, it is generally difficult to simultaneously increase the hearth voltage and the discharge current. Therefore, the input energy can not be increased beyond a certain level and adjustment of the input energy is restricted within a narrow range.

SUMMARY OF THE INVENTION

It is therefore an object of this invention to provide a plasma processing method capable of forming, on a surface of a substrate, a coating film having a uniform distribution of a film thickness.

It is another object of this invention to provide a plasma processing method capable of adjusting a flight distribution of vapor particles at a given discharge current.

It is still another object of this invention to provide a plasma processing method capable of melting various kinds of materials, in particular, those materials difficult to melt by adjusting a magnetic field in the vicinity of a hearth.

It is still another object of this invention to provide a plasma processing apparatus adapted to carry out the above-described plasma processing method.

Other objects of this invention will become clear as the description proceeds.

A plasma processing method to which this invention is applicable includes a beam source for producing a plasma beam and a hearth located in a vacuum chamber and having an incident surface for the plasma beam and comprises a step of guiding the plasma beam produced by the beam source to the incident surface of the hearth.

According to an aspect of this invention, the above-mentioned method further comprises the steps of forming a stationary magnetic field by the use of an annular permanent magnet arranged in the vicinity of the hearth to be concentric with a center axis of the hearth, forming an adjustable magnetic field by the use of an electromagnetic coil concentrically arranged with respect to the center axis of the hearth, and superposing the adjustable magnetic field on the stationary magnetic field to vary a magnetic field in the vicinity of the hearth.

According to another aspect of this invention, the above-mentioned method carries out a plasma processing operation comprising the steps of guiding the plasma beam produced by the beam source to the incident surface of the hearth, evaporating and ionizing a vaporizable material put on the hearth to produce vapor particles, varying a current supplied to the electromagnetic coil to adjust flight distribution of the vapor particles, and adhering the vapor particles onto a surface of a substrate arranged opposite to the hearth.

Meltability of the material on the hearth is adjusted by varying the current supplied to the electromagnetic coil.

A plasma processing apparatus according to this invention comprises a beam source for producing a plasma beam and a hearth located in a vacuum chamber and having an incident surface for the plasma beam and is for carrying out the process comprising a step of guiding the plasma beam produced by the beam source to the incident surface of the hearth.

According to an aspect of this invention, the above-mentioned plasma processing apparatus further comprises an annular permanent magnet arranged in the vicinity of the hearth to be concentric with a center axis of the hearth, an electromagnetic coil arranged in the vicinity of the annular permanent magnet to be concentric with the center axis of the hearth, and a power source connected to the electromagnetic coil.

According to another aspect of this invention, the electromagnetic coil is excited so that magnetic flux generated at a center side of the coil by the current supplied from the power source has a direction coincident to that of another magnetic flux generated at a center side of said annular permanent magnet.

BRIEF DESCRIPTION OF THE DRAWING

FIG. 1 is a view for describing a flight distribution of vapor particles in the vicinity of a hearth in a conventional ion plating apparatus;

FIG. 2 is a view for describing a flight distribution of vapor particles in the vicinity of a hearth in another conventional ion plating apparatus;

DESCRIPTION OF THE PREFERRED EMBODIMENT

Figure 3:
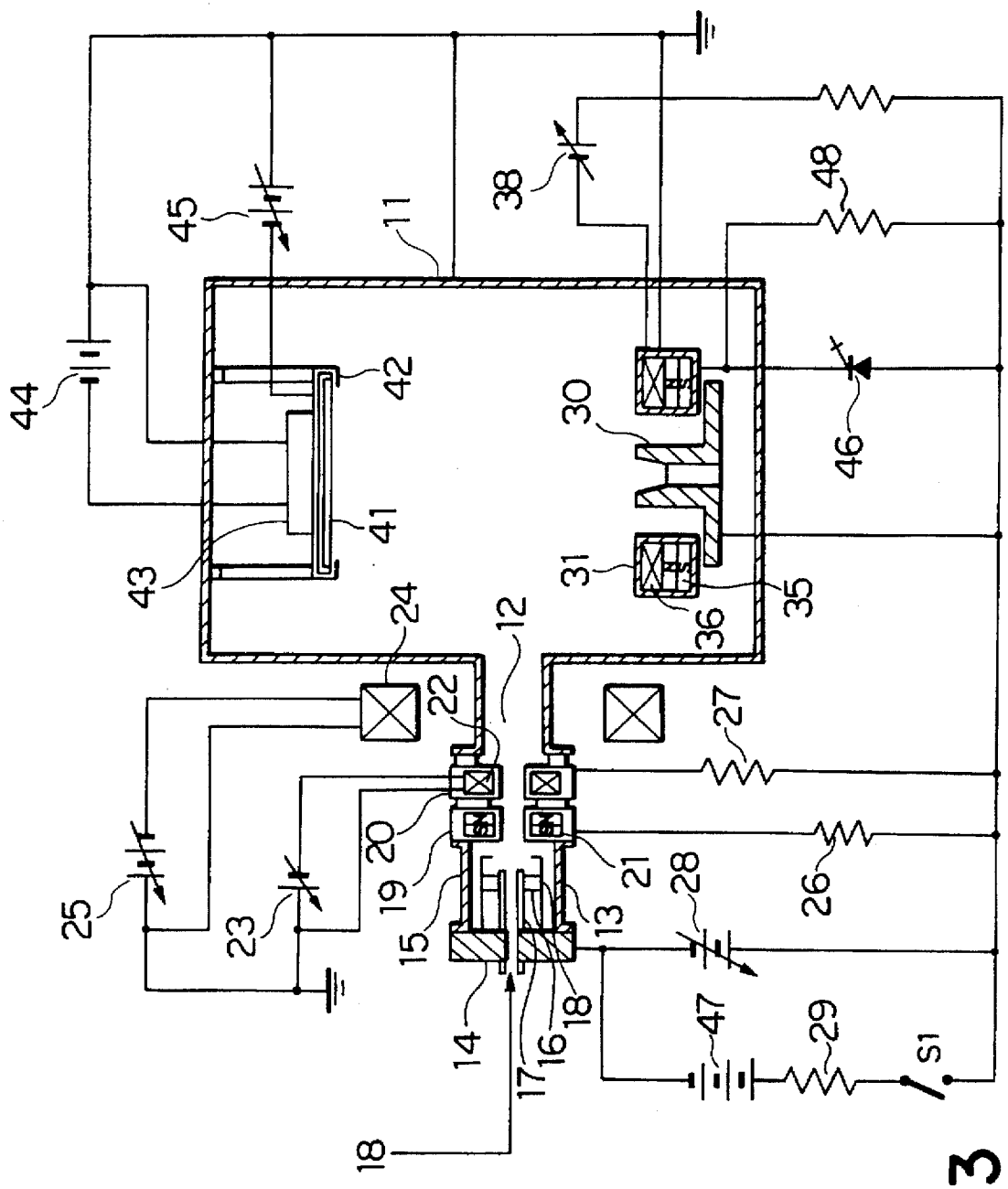
FIG. 3 is a schematic sectional view of a plasma processing apparatus according to an embodiment of this invention.

Referring to FIG. 1, a conventional plasma processing apparatus will at first be described in order to facilitate an understanding of a method of adjusting a flight distribution of vapor particles according to the present invention. In FIG. 1, the plasma processing apparatus is used as an ion plating apparatus and comprises a hearth 1 located in a vacuum chamber (not shown). The hearth 1 includes a permanent magnet 2 and receives an incident plasma beam produced by a pressure gradient plasma source which will later be described. An annular magnet 3 is arranged in the vicinity of the hearth 11 to be concentric with a center axis of the hearth 1. The annular magnet 3 serves to adjust the incident direction of the plasma beam incident to the hearth 1. Such an ion plating apparatus is disclosed in Japanese Unexamined Patent Publication No. Hei 7-138743 corresponding to Japanese Patent Application No. Hei 5-288163 by the present inventor.

In this conventional ion plating apparatus, when a coating film 5 is formed on a substrate (which is not restricted to a plate-like shape but also contains a film-like shape) 4 by the use of a large discharge current, the thickness of the coating film 5 becomes thinner at an area faced to the hearth 1 as the discharge current is increased. This is because the flight distribution of vapor particles produced by the hearth 1 exhibits a concave shape having a recessed portion above the hearth 1.

On the other hand, in a typical ion plating apparatus having no annular magnet 3, the thickness of the coating film 5 is thicker at the area faced to the hearth 1, as illustrated in FIG. 2. This is because the flight distribution of the vapor particles forms a convex shape having an expanding portion above the hearth 1. Such phenomenon is caused due to various factors, such as a proportion of a magnetic field, collision of the vapor particles resulting from an excessive spatial density, deviation of the flight distribution following excessive ionization, and nonuniform distribution of the current density directly above the hearth 1.

Description will now be made about a condition to uniformly adhere the vapor particles On the substrate 4. The distance between the hearth 1 and the substrate 4 is shortest at a portion of the substrate 4 Just above the hearth 1. The wider an angular distance from the portion just above the hearth 1 becomes, the longer the distance between the hearth 1 and the substrate 4 becomes. The portion just above the hearth 1 is substantially equivalent to a dot and has a very small area. The flight distance of the vapor particles slantly flying out from the portion Just above the hearth 1 becomes long and the landing area on the substrate becomes large. In this event, the film depositing condition is deteriorated. In order to uniformly adhere the vapor particles on the substrate 4, it is therefore necessary to make a greater amount of the vapor particles fly toward the substrate 4 when the angular distance from the portion Just above the hearth 1 becomes wider.

Taking the above into consideration, when the coating film is deposited by the use of the ion plating apparatus with the flight distribution of a concave shape, it is possible to achieve a substantially uniform distribution of a film thickness for a large area of the substrate 4. On the other hand, several problems still exist. For example, the flight distribution may be varied in dependence upon the current value of a beam current and the film deposition rate may be decreased. In particular, variation of the flight distribution of the vapor particles changes the condition for deposition of the coating film. This results in a serious problem of fluctuation of a film quality.

In the ion plating apparatus with the flight distribution of a convex shape, the following techniques in order to achieve uniform distribution of the film thickness is adapted. In the first technique, adjustment is made of a distance between the hearth 1 and the substrate 4. In the second technique, the substrate 4 is rotated or moved during deposition of the coating film. In the second technique, adjustment is made of the amount of the vaporizable material adhered onto the substrate by arranging a film thickness correction plate (a mask plate) between the hearth and the substrate. The film thickness correction plate has an opening portion which is wider in its peripheral region than in its central region just above the hearth. Therefore, a greater amount of the vaporizable material flies towards the peripheral region than to the central region just above the hearth.

The vaporizable material is uniformly deposited on the substrate by combination of horizontal movement of the substrate and the film thickness correction plate. In either of the first and the second methods, it is possible to achieve the uniform distribution of the film thickness. However, a film deposition rate becomes low and the vaporizable material can not be effectively used. This is because the vaporizable material often flies out of the substrate and may adhere onto the film thickness correction plate. In addition, in the second method, the apparatus is inevitably complicated in structure.

Referring to FIG. 3, the description will be made about a plasma processing apparatus for adhering vapor particles onto a substrate according to a preferred embodiment of this invention. In FIG. 3, a vacuum chamber 11 is provided with a cylindrical portion 12 formed at a side wall thereof. A pressure gradient plasma beam generator 13 is attached to the cylindrical portion 12. The plasma beam generator 13 comprises a cathode 14 and a glass tube 15 having one end closed by the cathode 14. In the glass tube 15, a cylinder 18 made of molybdenum (Mo) with a disk 16 made of $LaB_6$ and a pipe 17 made of tantalum (Ta) included therein is fixed to the cathode 14. The pipe 17 is for introducing a carrier gas 18 containing an inactive gas such as argon (Ar) and helium (He) into the plasma beam generator 13.

Between the other end of the glass tube 15 at the side opposite to the cathode 14 and the cylindrical portion 12, first and second intermediate electrodes 19 and 20 are concentrically arranged. The first intermediate electrode (first grid) 19 includes an annular permanent magnet 21 for converging the plasma beam. The second intermediate electrode 20 (second grid) includes an electromagnetic coil 22 for converging the plasma beam. The electromagnetic coil 22 is energized by a power source 23.

A steering coil 24 for guiding the plasma beam into the vacuum chamber 11 surrounds the cylinder 12 to which the plasma beam generator 13 is attached. The steering coil 24 is excited by a steering coil power source 25. Drooping resistors 26 and 27 are connected to the first and the second intermediate electrodes 19 and 20, respectively. A main power source 28 of a variable voltage type is connected between the cathode 14 and the first and the second intermediate electrodes 19 and 20 through the drooping resistors 26 and 27, respectively.

Figure 4:
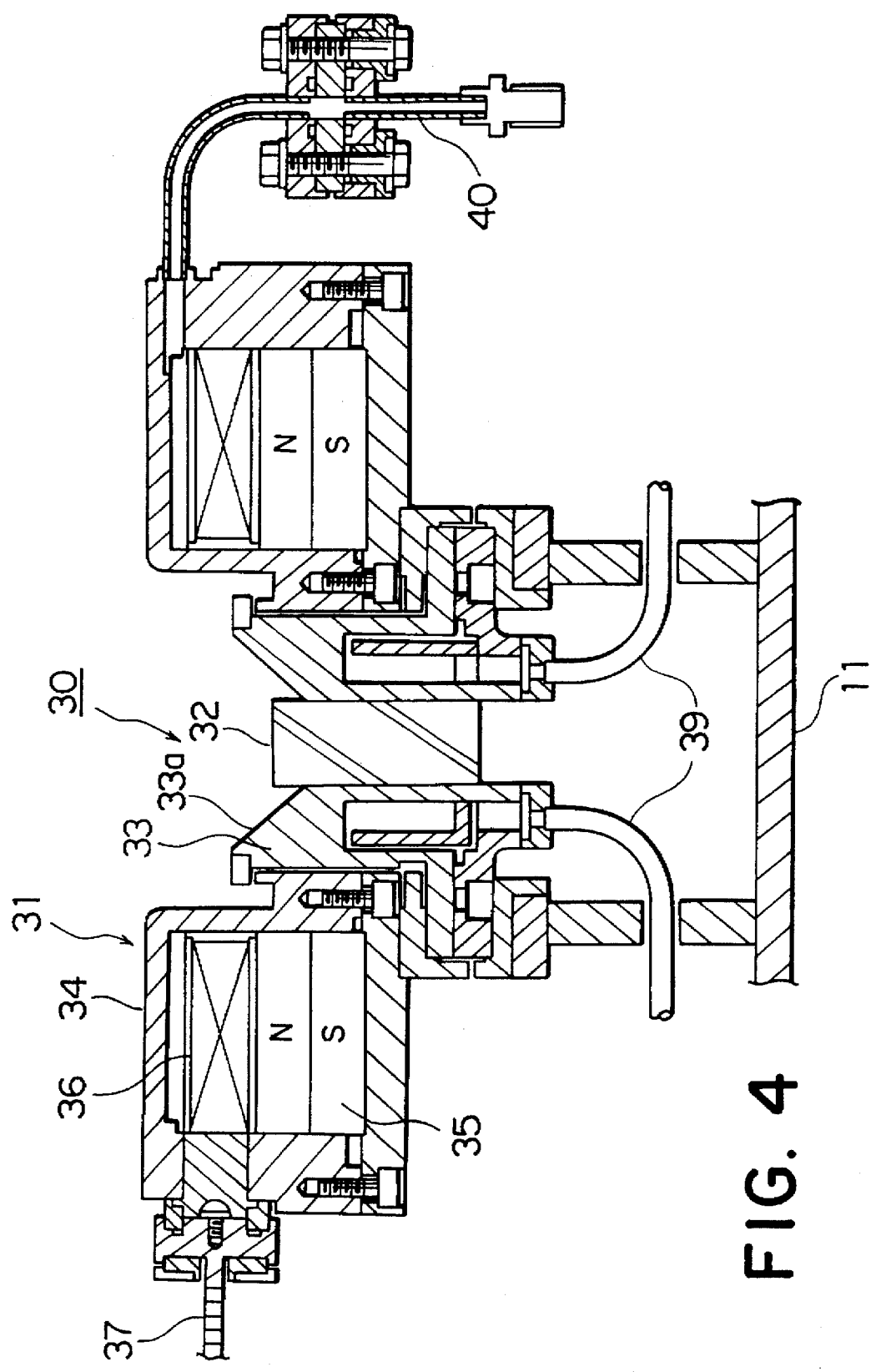
FIG. 4 is an enlarged sectional view of a hearth of the plasma processing apparatus illustrated in FIG. 3.

Referring to FIG. 4, a main hearth 30 and an annular auxiliary hearth 31 surrounding the main hearth 30 are arranged in the vacuum chamber 11 at an inner bottom portion thereof. The main hearth 30 comprises a cylindrical hearth body 33 and has a concave portion or depression 33a for receiving the plasma beam from the plasma beam generator 13. The hearth body 33 is provided with a through hole which receives a vaporizable material 32 such as an ITO (indium-tin oxide) tablet. The auxiliary hearth 31 comprises an annular case 34. An annular ferrite magnet 35 and a hearth coil 36 concentrically stacked are housed in the case 34. Both of the main hearth 30 and the auxiliary hearth 31 are made of an electroconductive material having a high heat conductivity, for example, copper. The auxiliary hearth 31 is attached to the main hearth 30 through an insulator. The main hearth 30 is connected to the auxiliary hearth 31 through a resistor 48. The main hearth 30 is connected to a positive side of the main power source 28. Thus, the main hearth 30 attracts the plasma beam produced by the plasma beam generator 13 to serve as an anode against the plasma beam generator 13.

The hearth coil 36 in the auxiliary hearth 31 forms electromagnetic and is fed from a hearth coil power source 38 (FIG. 3) through a wire 37. In this event, an arrangement is made such that central magnetic field generated by the excited hearth coil 36 has an orientation coincident with that of another central magnetic field generated by the ferrite magnet 35. The hearth coil power source 38 is a variable power source and can vary the electric current supplied to the hearth coil 36 by varying the voltage. As illustrated in FIG. 4, the main hearth 30 and the auxiliary hearth 31 are supplied with cooling water through cooling water pipes 39 and 40, respectively. In connection with the auxiliary hearth 31, only one pipe for supplying the cooling water is shown while another pipe for discharging the cooling water is not illustrated.

Turning to FIG. 3, a substrate 41 to which vapor particles are to be adhered is located in the vacuum chamber 11 and supported by a substrate holder 42 formed above the main hearth 30. A heater 43 is mounted on the substrate holder 42. The heater 43 is energized by a heater power source 44. The substrate holder 42 is supported by the vacuum chamber 11 but is electrically insulated therefrom. A bias power source 45 is connected between the vacuum chamber 11 and the substrate holder 42. Accordingly, the substrate holder 42 is biased to a negative potential with respect to the vacuum chamber 11 connected to a zero potential. The auxiliary hearth 31 is connected to a positive side of the main power source 28 through a hearth selecting switch 46. The main power source 28 is connected in parallel to a drooping resistor 29 and an auxiliary discharge power source 47 through a switch S1.

In the above-described plasma processing apparatus, electric discharge is generated between the cathode of the plasma beam generator 13 and the main hearth 30 located in the vacuum chamber 11 to thereby produce the plasma beam (not shown). The plasma beam is guided by the magnetic field defined by the steering coil 24 and the ferrite magnet 35 in the auxiliary hearth 31 and reaches the main hearth 30. The vaporizable material 32 included in the main hearth 30 is heated by the plasma beam to be evaporated. The vaporizable material 32 is ionized by the plasma beam and is adhered onto the surface of the substrate 41 applied with a negative voltage. As a result, a coating film is formed.

Figure 5:
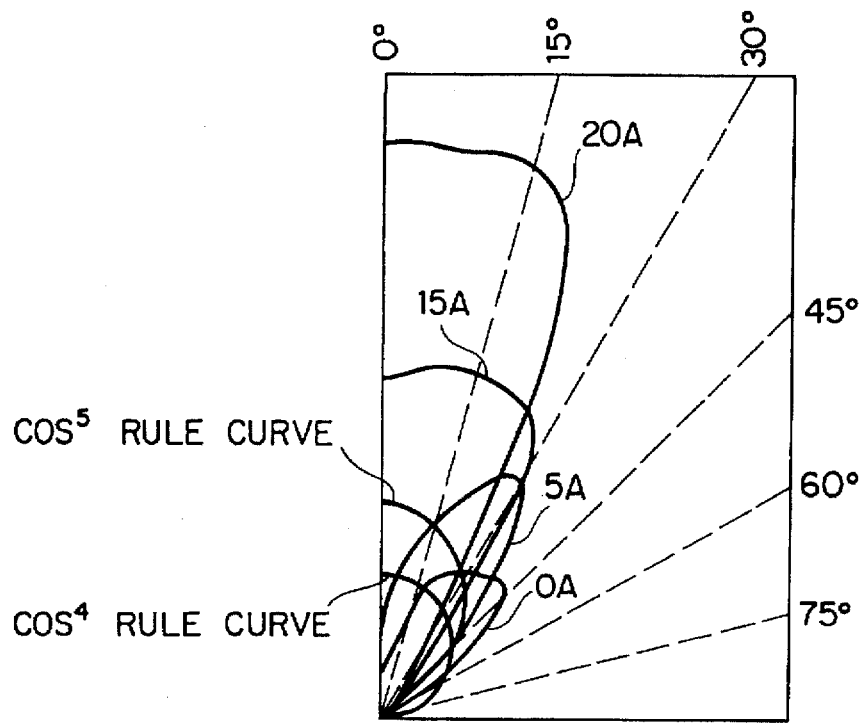
FIG. 5 is a graph for describing a principle of operation according to this invention.
Figure 6:
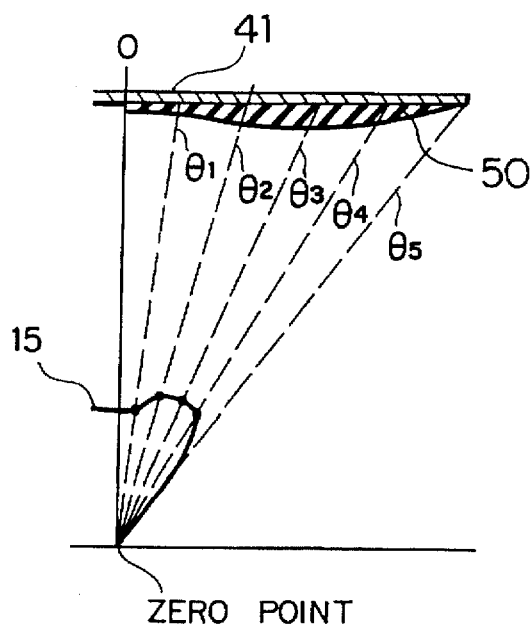
FIG. 6 is a sectional view of a substrate for describing a distribution of a film thickness of a coating film formed according to this invention.

FIG. 5 is a graph showing the flight distribution of the vapor particles in the plasma processing apparatus according to this invention. Herein, the discharge current (plasma beam current) is fixed at 100 (A) which the current IhA flowing through the hearth coil 36 in the auxiliary hearth 31 is varied at 0 (A), 5 (A), 15 (A), 20 (A) to vary the magnetic field generated by the hearth coil 36. An ordinate in this graph represents the thickness of the coating film 50 formed on the surface of the substrate 41 as illustrated in FIG. 6.

In FIG. 5, dotted lines represent emitting directions of the vapor particles flying from the main hearth 30 to the surface of the substrate 41. Herein, a perpendicular line from the main hearth 30 to the surface of the substrate 41 is defined as 0°. The directions forming angles of $\theta_1=15°$, $\theta_2=30°$, $\theta_3=30°$, $\theta_4=40°$, $\theta_5=75°$ with respect to the perpendicular line are shown.

In FIG. 5, the flight distribution of the vapor particles is shown as follows. Specifically, the flight distribution is represented by a curve obtained by measuring the film deposition rate by a quartz oscillator thickness meter of a water-cooling type and by plotting measurment values measured at the above-mentioned angles. For reference, those curves of the flight distribution under the $\cos^4$ rule and the $\cos^5$ rule, which are believed to be the flight distribution in the typical vacuum deposition, are shown together.

It is understood from FIG. 5 that the flight distribution of the vapor particles is varied by varying the current IhA. Specifically, when the current IhA is equal to 0 (A) (equivalent to the case of the ferrite magnet 35 alone), the flight distribution has a concave shape having the minimum value at a portion just above the hearth. As the current IhA is increased, the flight distribution approaches to the flight distribution of a convex shape having the maximum value at the portion just above the hearth as obtained by the typical plasma processing. When the current IhA is equal to 20 (A), the flight distribution is almost flat in an area just above the hearth and thereabound. It is also understood that the range of the flight angle of the vapor particles becomes small as the current IhA increases. This means that as the current IhA increases, the film deposition area becomes small and the film deposition rate is consequently increased.

From those experimental results, it is understood that the film thickness distribution on the surface of the substrate 41 and the film deposition rate can be adjusted by controlling the electric current supplied to the hearth coil 36 concentrically stacked on the ferrite magnet 35.

Figure 7:
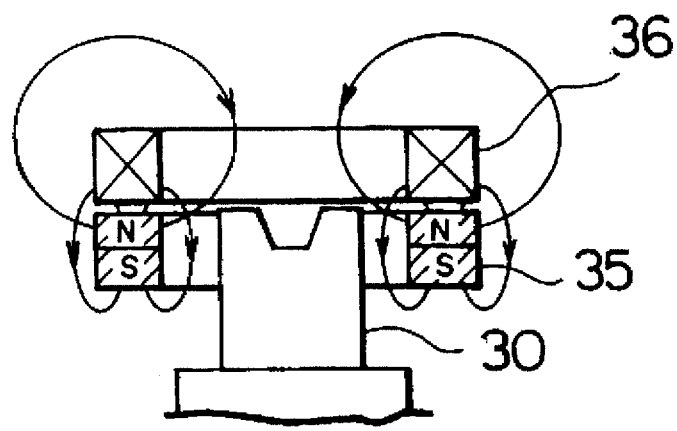
FIG. 7 is a view for describing a relationship between a permanent magnet and a hearth coil of the hearth illustrated in FIG. 3.
Figure 8:
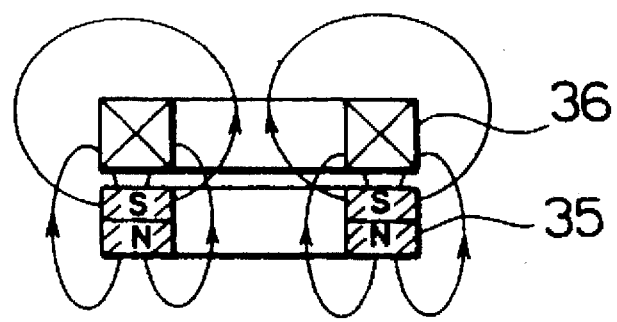
FIG. 8 is a view for describing another example of the relationship between the permanent magnet and the hearth coil illustrated in FIG. 7.

In the foregoing embodiment, the hearth coil 36 is stacked on the ferrite magnet 35 with its N pole located upside, as illustrated in FIG. 7. Alternatively, as illustrated in FIG. 8, the hearth coil 36 may be stacked on the ferrite magnet 35 with its S pole located upside. In this case, the direction of the current supplied to the hearth coil 36 is reversed from that illustrated in FIG. 7.

Figure 9:
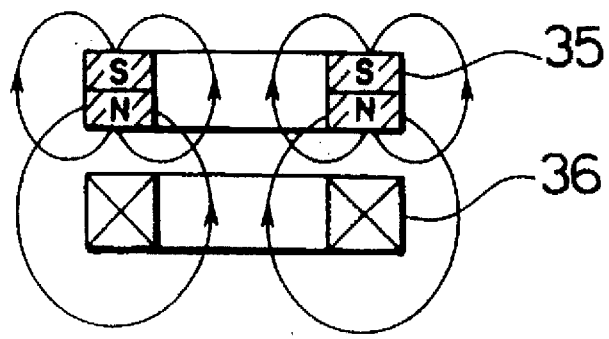
FIG. 9 is a view for describing still another example of the relationship between the permanent magnet and the hearth coil illustrated in FIG. 7.
Figure 10:
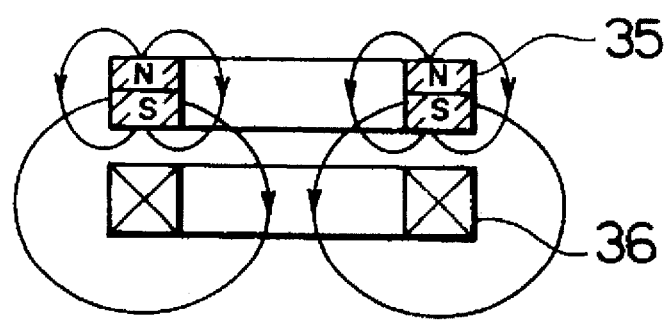
FIG. 10 is a view for describing yet another example of the relationship between the permanent magnet and the hearth coil illustrated in FIG. 7.

Referring to FIG. 9, the hearth coil 36 may be stacked under the ferrite magnet 35 with its S pole located upside. Furthermore, referring to FIG. 10, the hearth coil 36 may be stacked under the ferrite magnet 35 with its N pole located upside. In either event, the electric current is made to flow so that the central magnetic field generated by the excited hearth coil 36 has an orientation coincident with that of another central magnetic field generated by the ferrite magnet 35, as described in the foregoing.

Next, description will be about a plasma processing apparatus for melting a material according to an embodiment of this invention. The plasma processing apparatus according to this embodiment does not require the substrate 41, the substrate holder 42, the heater 43, the heater power source 44, and the bias power source 45 illustrated in FIG. 3.

In the plasma processing apparatus according to this embodiment, electric discharge is generated between the cathode of the plasma beam generator 13 and the main hearth 30 located in the vacuum chamber 11 to thereby produce the plasma beam (not shown). The plasma beam is guided by the magnetic field defined by the steering coil 24 and the ferrite magnet 5 in the auxiliary hearth 31 and reaches the main hearth 30. The material included in the main hearth 30 is heated by the plasma beam to be melted.

At that time, the meltability is defined by the input energy supplied to the main hearth 30. The input energy is determined by the product of the hearth voltage and the discharge current. Therefore, in order to increase the input energy, it is necessary to increase both the hearth voltage and the discharge current.

In a conventional apparatus, for example, the above-described Japanese Unexamined Patent Publication No. Hei 7-138743, it is possible to increase the hearth voltage but it is not possible to increase the discharge current. On the contrary, the plasma processing apparatus without an annular magnet 3 is able to increase the discharge current but is unable to increase the hearth voltage.

In the conventional apparatus, it is difficult to adjust the discharge current and the hearth voltage independently from each other. In the plasma processing apparatus according to this invention, it is possible to adjust the magnetic field in the vicinity of the main hearth 30 by varying the current supplied to the hearth coil 36 so as to vary the characteristic of the discharge current and the hearth voltage.

According to present invention, when no electric current is supplied to the hearth coil 36, a great amount of the discharge current does not flow. However, if the current supplied to the hearth coil 36 is gradually increased, a great Mount of the discharge current flows while the hearth voltage is kept at a substantially constant level. Thus, by adjusting the current supplied to the hearth coil 36, the maximum input energy can be obtained at a point where the hearth voltage becomes high and the discharge current is increased. It is therefore possible to easily melt the material which is hard to melt as compared with the conventional apparatus. Since the hearth voltage and the discharge current can be adjusted, the input energy can be varied over a wide range. Accordingly, it is possible to melt a wide variety of materials.

Next, description will be made about another embodiment in which a reaction gas, such as $O_2$, $F_2$, and $N_2$ is blown to an area above the main hearth 30 in the vicinity thereof to subject the substrate 41 to etching, ashing, and film deposition processes. In this embodiment, the reaction gas is blown from a position between the main hearth 30 and the auxiliary hearth 31. Alternatively, the reaction gas is blown from a reaction gas supply pipe arranged above the main hearth 30 in the vicinity thereof. Since a highly concentrated plasma is obtained even in a low gas pressure, the supplied gas is effectively ionized. As a result, it is possible to carry out the etching operation at a high aspect ratio.

What is claimed is:

1. A plasma processing method which includes a beam source for producing a plasma beam and a hearth located in a vacuum chamber and having an incident surface for said plasma beam and which comprises a step of guiding said plasma beam produced by said beam source to the incident surface of said hearth, said method comprising the steps of:

forming a stationary magnetic field by the use of an annular permanent magnet arranged in the vicinity of said hearth to be concentric with a center axis of said hearth;

forming an adjusting magnetic field by the use of an electromagnetic coil concentrically arranged with respect to the center axis of said hearth; and superposing said adjustable magnetic field on said stationary magnetic field to vary a magnetic field in the vicinity of said hearth.

2. A plasma processing method as claimed in claim 1, which comprises the steps of guiding said plasma beam produced by said beam source to the incident surface of said hearth, evaporating and ionizing a vaporizable material put on said hearth to produce vapor particles, varying a current supplied to said electromagnetic coil to adjust flight distribution of said vapor particles, and adhering said vapor particles onto a surface of a substrate arranged opposite to said hearth.

3. A plasma processing method as claimed in claim 1, which comprises the step of varying a current supplied to said electromagnetic coil to adjust a melting rate of the material put on said hearth.

4. A plasma processing method as claimed in claim 1, further comprising the step of maintaining the hearth at a positive electric potential.

5. A plasma processing apparatus which includes a beam source for producing a plasma beam and a hearth located in a vacuum chamber and having an incident surface for said plasma beam and which is for carrying out a plasma processing operation comprising a step of guiding said plasma beam produced by said beam source to the incident surface of said hearth, said apparatus further comprising:

an annular permanent magnet arranged in the vicinity of said hearth to be concentric with a center axis of said hearth;

an electromagnetic coil arranged in vicinity of said annular permanent magnet to be concentric with the center axis of said hearth; and a power source connected to said electromagnetic coil.

6. A plasma processing apparatus as claimed in claim 5, wherein said electromagnetic coil is excited so that magnetic flux generated at a center side of said coil by the current supplied from said power source has a direction coincident to that of another magnetic flux generated at a center side of said annular permanent magnet.

7. A plasma process apparatus as claimed in claim 5, wherein said power source maintains said hearth at a positive electric potential.

* * * * *